United States Patent
Wang et al.

(10) Patent No.: US 8,563,964 B2
(45) Date of Patent: Oct. 22, 2013

(54) LIGHT EMITTING SEMICONDUCTOR DEVICE

(75) Inventors: Chao-Hsun Wang, Zhongli (TW);
Zhen-Yu Li, Chiayi County (TW);
Hao-Chung Kuo, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/067,822

(22) Filed: Jun. 29, 2011

(65) Prior Publication Data

US 2012/0217469 A1 Aug. 30, 2012

(30) Foreign Application Priority Data

Feb. 25, 2011 (TW) .............................. 100106427 A

(51) Int. Cl.
*H01L 29/06* (2006.01)
(52) U.S. Cl.
USPC ........... 257/13; 257/43; 257/76; 257/E33.008
(58) Field of Classification Search
None
See application file for complete search history.

(56) References Cited

U.S. PATENT DOCUMENTS

| 2010/0133567 A1* | 6/2010 | Son | 257/98 |
| 2011/0127565 A1* | 6/2011 | Son | 257/99 |
| 2012/0056152 A1* | 3/2012 | Li et al. | 257/13 |

OTHER PUBLICATIONS

Wang et al. C. H.; Hole Injection and Efficiency Droop Improvement in InGaN/GaN Light-Emitting Diodes by Band-engineered Electron Blocking Layer, Applied Physics Letters 97, Downloaded Dec. 28, 2010, 261103-1-261103-3, 2010, American Institute of Physics.

* cited by examiner

*Primary Examiner* — Marvin Payen
(74) *Attorney, Agent, or Firm* — Bacon & Thomas, PLLC

(57) ABSTRACT

A semiconductor light emitting device is disclosed, which comprises: a substrate having a first surface and a second surface; a first semiconductor conductive layer is disposed on the first surface of the substrate; an insert layer is disposed on the first semiconductor conductive layer; an active layer is disposed on the insert layer; a second semiconductor conductive layer is disposed on the active layer; a first electrode is disposed on the second semiconductor conductive layer; and a second electrode is disposed on the second surface of the substrate, in which the electric of the second electrode is opposite to that of the first electrode.

2 Claims, 9 Drawing Sheets

LIGHT EMITTING SEMICONDUCTOR DEVICE

BACKGROUND OF THE INVENTION

1. Field of the Invention

The invention mainly discloses a semiconductor light emitting device, particularly discloses a semiconductor light emitting device having an insert layer.

2. Description of the Prior Art

Please refer to FIG. 1, which shows the structure of a conventional semiconductor light emitting device 100, which includes: a substrate 102; a first semiconductor conductive layer 104 is disposed on the substrate 102; an active layer 106 is disposed on the first semiconductor conductive layer 104; an electron blocking layer 108 is disposed on the active layer 106; a second semiconductor conductive layer 110 is disposed on the electron blocking layer 108, in which the electric of the second semiconductor conductive layer 110 is opposite to that of the first semiconductor conductive layer 104; a first electrode 122 is disposed on the second semiconductor conductive layer 110; and a second electrode 124 is disposed on another surface of the substrate 102.

As shown in FIG. 2, for the structure of another conventional semiconductor light emitting device 200, which includes: a substrate 202; a first semiconductor conductive layer 204 having a first part (not shown in the figure) and a second part (not shown in the figure) which are disposed on the substrate 202; an active layer 206 is disposed on the first part of the first semiconductor conductive layer 204; an electron blocking layer 208 is disposed on the active layer 206; a second semiconductor conductive layer 210 is disposed on the electron blocking layer 208, in which the electric of the second semiconductor conductive layer 210 is opposite to that of the first semiconductor conductive layer 204; a first electrode 222 is disposed on the second semiconductor conductive layer 210; and a second electrode 224 is disposed on the second part of the first semiconductor conductive layer 204, in which the electric is separated from the element on the first part of the first semiconductor conductive layer 204.

From the above-mentioned structure, it is known that the use of broad energy gap semiconductor material as the carrier blocking layer 108, 208 has become very common application in the semiconductor light emitting device 100, 200, such as laser diode and light emitting diode. However, it is mentioned in the prior art, utilizing certain amount of aluminum gallium nitride as the electron blocking layer 108, 208 can reduce the overflow of electron greatly. Also, the electron blocking layer will influence the electron hole 108, 208, it will be more difficult to inject into the active layer 106, 206. While in the other prior art, the P-type gallium nitride layer using gradually change doping concentration can influence the advancing behavior of carrier in energy band diagram. As shown in FIG. 3, in the other prior art, it is mentioned that utilizing the quantum energy barrier with super lattice can further prevent the overflow of the electron. However, even the above-mentioned methods can prevent the overflow of the electron successfully, it will increase the difficulty for injecting the electron hole into the active layer 106, 206, and it will become harder to manufacture the light emitting device.

Refer to FIG. 4, when the conventional light emitting device is operated under forward bias, the valance electron band diagram of electron blocking layer will be triangular shape, due to the factor of internal polarization field and forward bias. The valance electron band of electron blocking layer is declined upwards from the conductive layer of N-type semiconductor conductive layer to P-type semiconductor conductive layer, which blocks the transmission ability of electron hole passing through this triangular blocking layer. However, if the aluminum content is increased from P-type semiconductor conductive layer to N-type semiconductor conductive layer in electron blocking layer, the band-gap will be increased gradually. Thus, when the slope of valance electron band is increased, the barrier in valance electron band will become flat and maybe overturned.

SUMMARY OF THE INVENTION

In view of the above-mentioned problem of prior art, the main purpose of the invention is to provide a semiconductor light emitting device, wherein the material layer with a broad energy gap can be used as an electron blocking layer and electron hole injection layer, which can prevent the overflow of the electron effectively and increase the injection efficiency of electron hole.

Another purpose of the invention is to provide a semiconductor light emitting device, wherein the material layer with a broad energy gap can be used as an electron blocking layer and electron hole injection layer, which can reduce the barrier of the valance electron band, so that the electron hole can be injected into the active surface to associate with the electron to emit the light more easily, and the overflow of the electron can be prevented to increase the efficiency of the semiconductor light emitting device.

According to the above-mentioned purpose, the invention discloses a semiconductor light emitting device is provided, which includes: a substrate having a first surface and a second surface; a first semiconductor conductive layer is disposed on the first surface of the substrate; an insert layer is disposed on the first semiconductor conductive layer; an active layer is disposed on the insert layer; a second semiconductor conductive layer is disposed on the active layer; a first electrode is disposed on the second semiconductor conductive layer; and a second electrode is disposed on the second surface of the substrate, in which the electric of the second electrode is opposite to that of the first electrode.

The invention discloses another semiconductor light emitting device is provided, which includes: a substrate; a second semiconductor conductive layer having a first part and a second part which is disposed on the substrate; an active layer is disposed on the first part of the second semiconductor conductive layer; an insert layer is disposed on the active layer; a first semiconductor conductive layer is disposed on the gradually change insert layer, in which the electric of the second semiconductor conductive layer first is opposite to that of the second semiconductor conductive layer; a first electrode is disposed on the first semiconductor conductive layer; and a second electrode is disposed on the second part of the second semiconductor conductive layer, in which the electric of the second electrode is opposite to that of the first electrode. Because of the insert layer is a material layer with a broad energy gap which can be used as an electron blocking layer and electron hole injection layer. Thus, when the insert layer used to replace the electron blocking layer, the barrier of the valence electron band can be reduced so that the electron hole can be injected into the active surface to associate with the electron to emit the light, and the overflow of the electron can be prevented to increase the efficiency of the semiconductor light emitting device.

In order to further understand the purpose, structure, features and functions of the invention, the following detail description is described with the attached embodiments.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The direction of the invention explores a semiconductor light emitting device here. In order to understand the invention thoroughly, the structure and steps of semiconductor light emitting device will be provided in detail in the following description. Obviously, the implementation of the invention has not been limited to the special detail of the semiconductor light emitting device for those skilled in the art. However, the preferred embodiment of the invention will be described in detail as follows. Except these detailed description, the invention can also be widely implemented in other embodiments. And it is not intended that the scope of the invention be limited to the description as set forth herein, which can be changed and modified slightly. So claims attached in this paper would be used for the scope of the invention.

Figure 1:
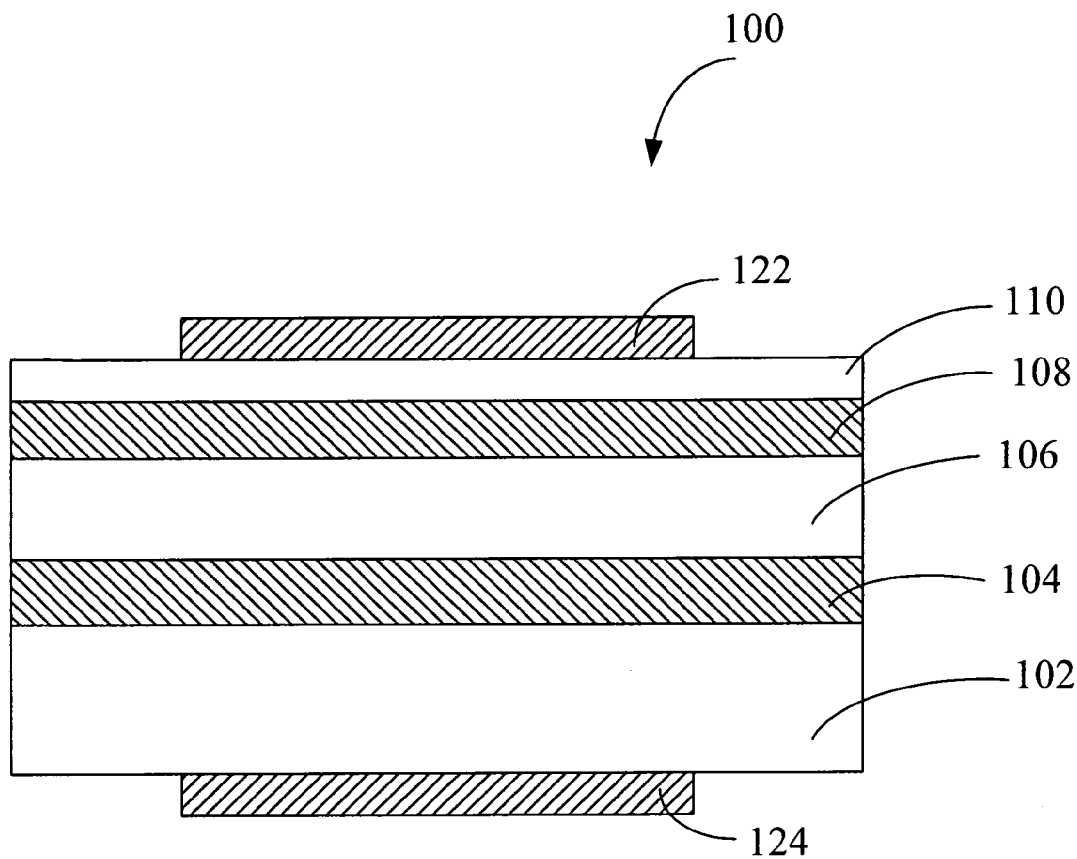
FIG. 1 is a graph illustrating the structure of a semiconductor light emitting device according to the conventional technology.
Figure 2:
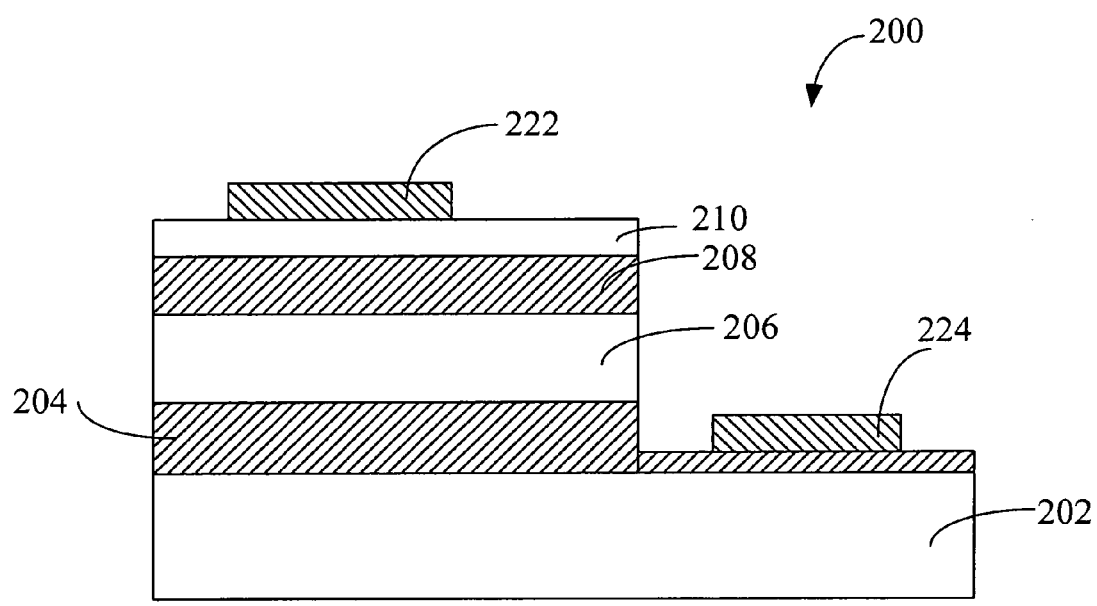
FIG. 2 is a graph illustrating the structure of a semiconductor light emitting device according to the conventional technology.
Figure 3:
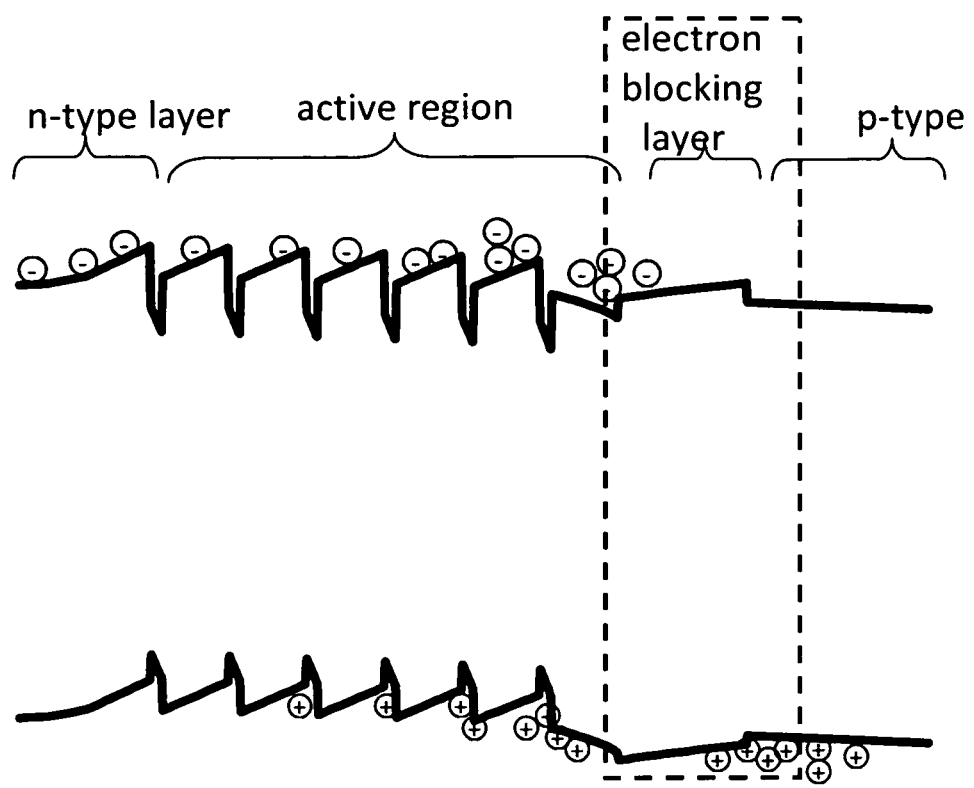
FIG. 3 is a graph illustrating a conventional semiconductor light emitting device with a broad energy gap according to the conventional technology, and its influence on the carrier behavior.
Figure 4:
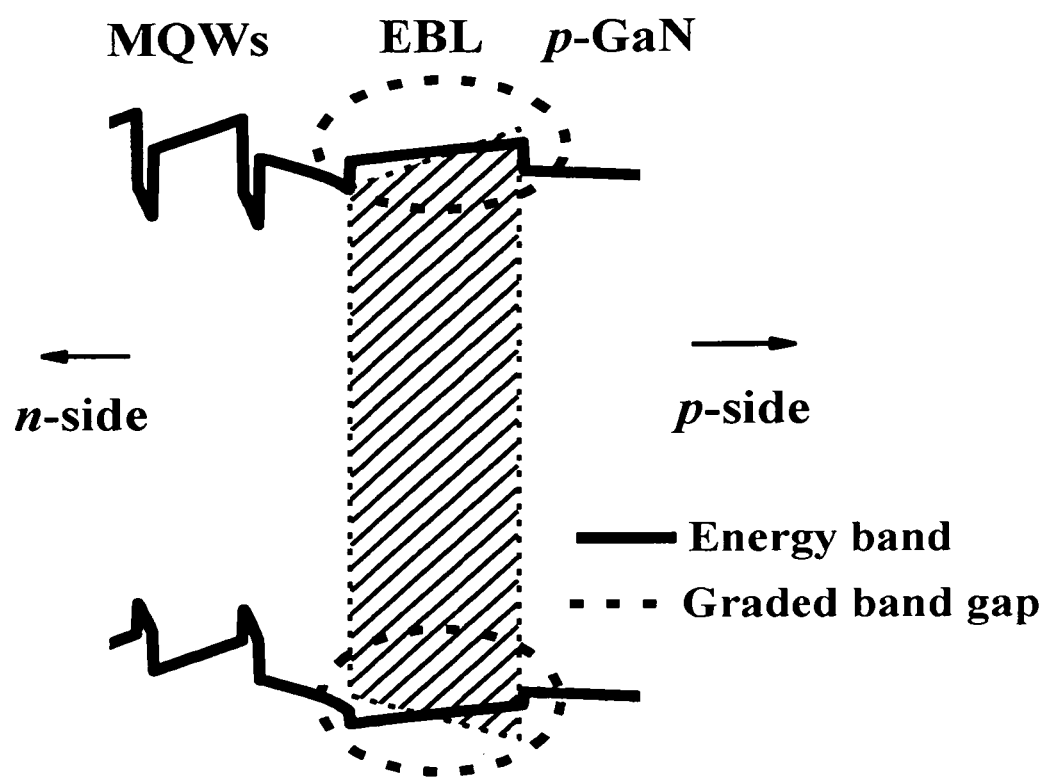
FIG. 4 is a graph illustrating the valance electron band diagram of electron blocking layer when the conventional light emitting device is operated under forward bias, due to the factor of internal polarization field and forward bias.
Figure 5:
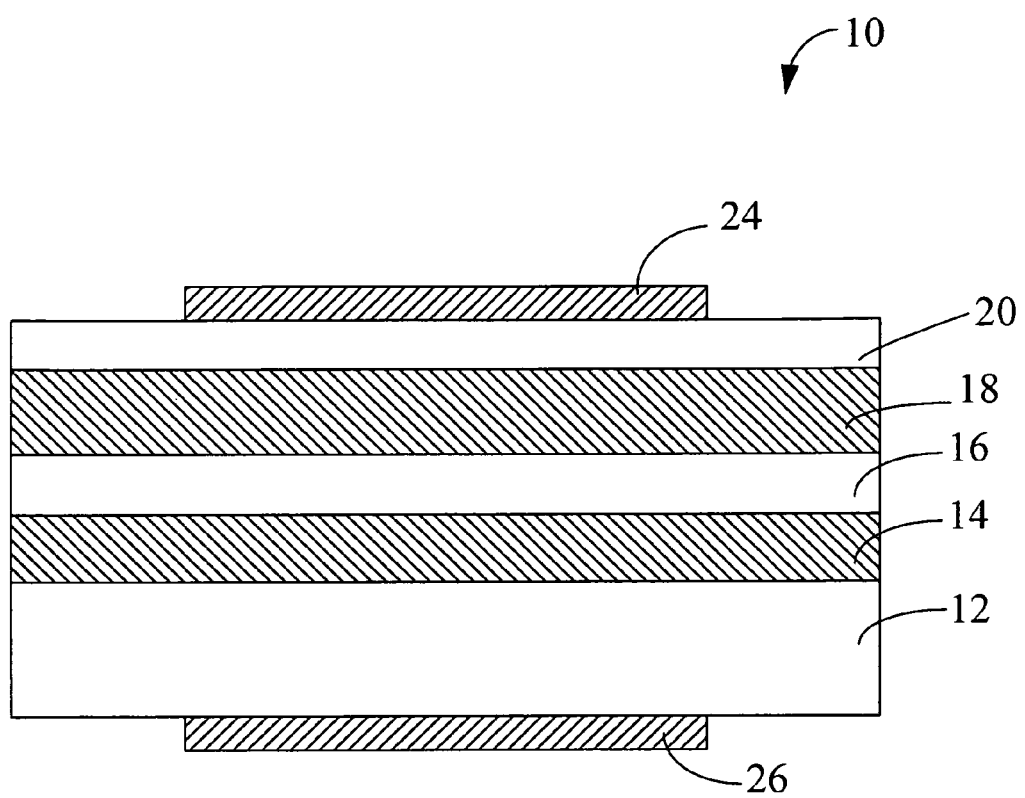
FIG. 5 is a graph illustrating the structure of a semiconductor light emitting device according to the technology disclosed by the invention.

Please refer to FIG. 5, which illustrates an embodiment for a semiconductor light emitting device disclosed by the invention. As shown in FIG. 5, the semiconductor light emitting device 10 comprises: a substrate 12 having a first surface (not shown in the figure) and a second surface (not shown in the figure); a first semiconductor conductive layer 14 is disposed on the first surface of the substrate 12; an insert layer 16 is disposed on the first semiconductor conductive layer 14; an active layer 18 is disposed on the insert layer 16; a second semiconductor conductive layer 20 is disposed on the active layer 18, in which the second electric of the second semiconductor conductive layer 20 is opposite to the first electric of the first semiconductor conductive layer 14; a first electrode 24 is disposed on the second semiconductor conductive layer 20; and a second electrode 26 is disposed on the second surface of the substrate 12, in which the fourth electric of the second electrode 26 is opposite to the third electric of the first electrode 24.

It should be described here, if the first semiconductor conductive layer 14 is P-type semiconductor conductive layer, then the second semiconductor conductive layer 20 will be N-type semiconductor conductive layer. In addition, in another preferred embodiment of the invention, if the first semiconductor conductive layer 14 is N-type semiconductor conductive layer, then the second semiconductor conductive layer 20 will be P-type semiconductor conductive layer, as the semiconductor light emitting device 11 shown in FIG. 6. Thus, when the first semiconductor conductive layer 14 is N-type semiconductor conductive layer and the second semiconductor conductive layer 20 is P-type semiconductor conductive layer, a transparent conductive layer 22 is included between the first electrode 24 and the second semiconductor conductive layer 20.

Figure 7:
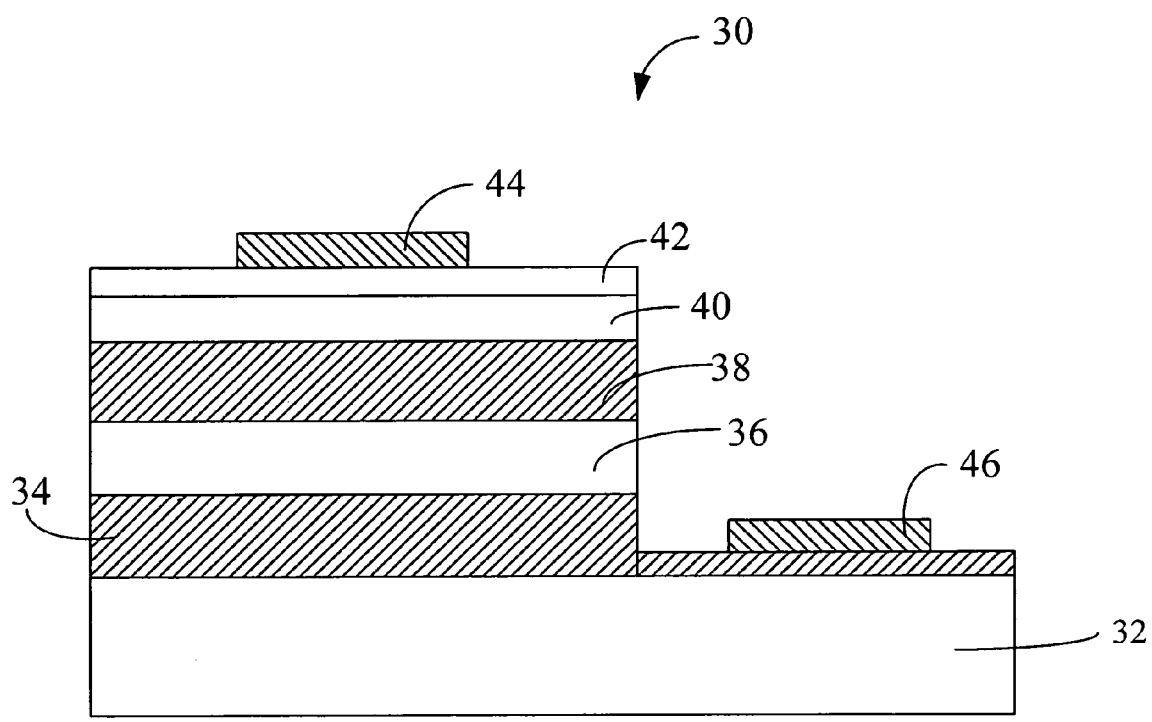
FIG. 7 is a graph illustrating the structure of a semiconductor light emitting device according to the technology disclosed by the invention.

Please refer to FIG. 7, which illustrates another embodiment for a semiconductor light emitting device disclosed by the invention. The semiconductor light emitting device 30 includes: a substrate 32; a first semiconductor conductive layer 34 having a first part (not shown in the figure) and a second part (not shown in the figure) which are disposed on the substrate 32; an active layer 36 is disposed on the first part of the first semiconductor conductive layer 34; an insert layer 38 is disposed on the active layer 36; a second semiconductor conductive layer 40 is disposed on the insert layer 38, in which the electric of the second semiconductor conductive layer 40 is opposite to that of the first semiconductor conductive layer 34, that is when the first semiconductor conductive layer 34 is N-type semiconductor conductive layer, then the second semiconductor conductive layer 40 will be P-type semiconductor conductive layer; a transparent conductive layer 42 is disposed on the second semiconductor conductive layer 40; a first electrode 44 is disposed on the transparent conductive layer 42; and a second electrode 46 is disposed on the second part of the first semiconductor conductive layer 34, in which the electric is separated from the element on the first part of the first semiconductor conductive layer 34, and the electric of the second electrode 46 is opposite to that of the first electrode 44.

Figure 6:
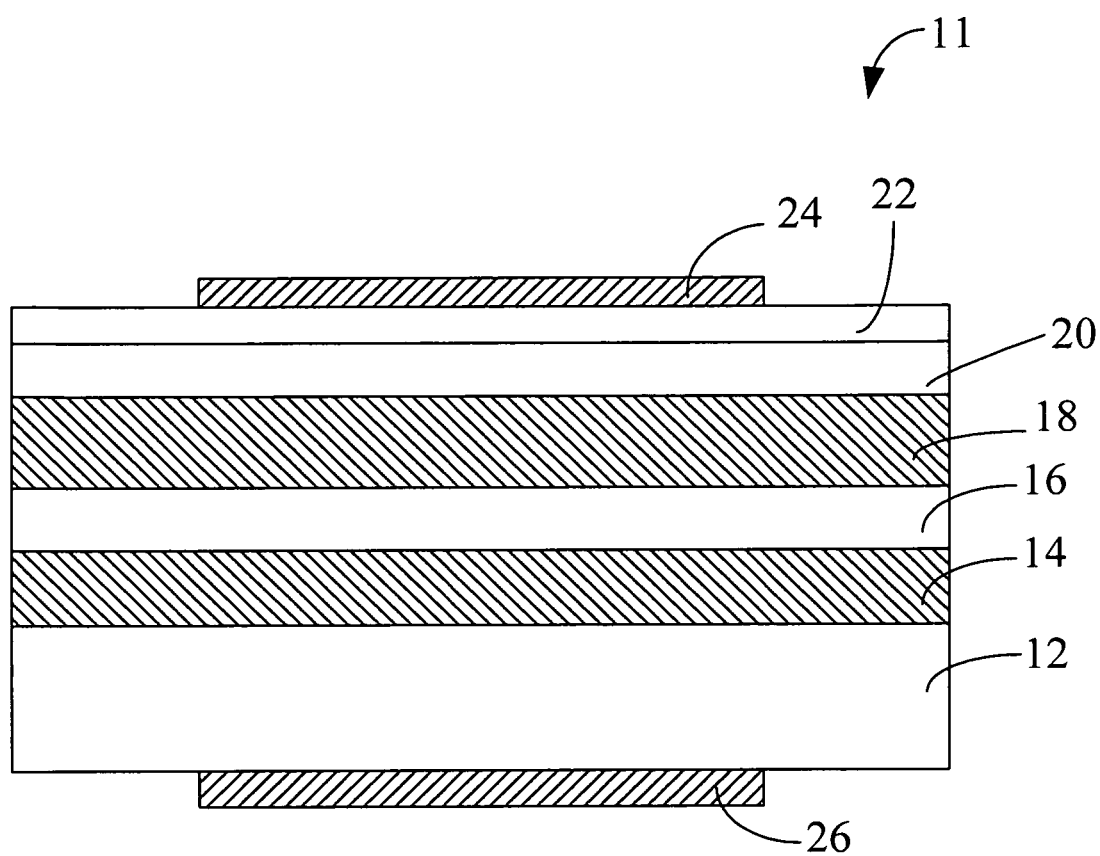
FIG. 6 is a graph illustrating another preferred embodiment of a semiconductor light emitting device according to the technology disclosed by the invention.

In the embodiments of the invention, the semiconductor light emitting devices shown in FIG. 5, FIG. 6 and FIG. 7 may be the light emitting diode, semiconductor laser or laser diode. In addition, the material of substrate 12, substrate 32 shown in FIG. 5, FIG. 6 and FIG. 7 may be the sapphire, spinelle(MgAl$_2$O$_4$), gallium nitride(GaN), aluminum nitride (AlN), silicon carbide(SiC), gallium arsenide(GaAs), gallium phosphide(GaP), silicon(Si), germanium(Ge), zinc oxide(ZnO), magnesium oxide(MgO), LAO, LGO and glass; the active layer 18, active layer 38 may be the quantum well or multi-quantum well, and its material may be gallium nitride (GaN) or indium gallium nitride/gallium nitride (InGaN/GaN); and the material of transparent conductive layer 22, transparent conductive layer 42 may be the indium tin oxide (ITO), tin oxide(ZnO) or nickel/gold alloy (Ni/Au alloy), CTO, titanium tungsten nitride (TiWN), indium trioxide (In$_2$O$_3$), tin dioxide(SnO$_2$), cadmium oxide(CdO), zinc oxide (ZnO), copper gallium oxide(CuGaO$_2$), and strontium copper oxide(SrCu$_2$O$_2$).

In addition, according to the above-mentioned structure, the epitaxial grow method is employed to form the semiconductor light emitting device disclosed by the invention, such as the metal organic chemical vapor deposition (MOCVD) or hydride vapor phase epitaxy (HVPE) or molecular beam epitaxy (MBE) or hot wall epitaxy.

In the embodiments of the invention, the material layer with a broad energy gap is used as the insert layer 16, insert layer 36 to replace conventional electron blocking layer disposed on P-type semiconductor conductive layer 14, P-type semiconductor conductive layer 34, in which the material of insert layer 16, insert layer 36 may be aluminum indium gallium nitride ($Al_xIn_yGa_{1-x-y}N$). The aluminum indium gallium nitride layer is composed by $Al_xIn_yGa_{1-x-y}N$, in which the aluminum content is 0≤x≤0.9, the indium content is 0≤y≤0.3, and the gallium content is balanced with respect to aluminum and indium. It should be described here, the element content in the insert layer 16, insert layer 36 is formed by gradually change way in the insert layer 16, insert layer 36, that the content of aluminum, indium and/or gallium is different in every insert layer 16, insert layer 36, and the content may be increased from bottom layer to top layer or from top layer to bottom layer. For example, the aluminum content in aluminum indium gallium nitride is from 0 to 0.9, which may be increased from 0 of top layer to 0.9 of bottom layer in insert layer 16, insert layer 36. Similarly, the indium content in aluminum indium gallium nitride is from 0 to 0.9, which may be increased from 0 of top layer to 0.3 of bottom layer in insert layer 16, insert layer 36. The gallium content in aluminum indium gallium nitride is balanced with respect to aluminum and indium, which is also different in every insert layer 16, insert layer 36.

On the contrary, the same performance can be obtained from decreased element content in every insert layer. Thus from the above-mentioned description, it is known that the purpose of insert layer 16, insert layer 36 in the invention is: 1. Gradually change content; and 2. Gradually change of energy gap caused by gradually change content of aluminum, indium and gallium, and the thickness of insert layer 16, insert layer 36 is about 5 nm to 40 nm. In the embodiment, as for the semiconductor light emitting device 10, semiconductor light emitting device 20 with the insert layer 16, insert layer 36 to be discussed, the aluminum content in the insert layer 16, insert layer 36 is 0%~15%, 25% and 35%. In the conventional light emitting device, the aluminum content in the electron blocking layer (not shown in the figure) is fixed to about 15% normally. It is generally acknowledged that the simulated physical parameter is 50% of shielding phenomenon. The ratio of conduction-valance band offset on the interface is 67:33. The Shockley-Read-Hall recombination life cycle is 1 ns, and the Auger recombination coefficient in the quantum well is $2*10\text{-}30\ cm^6/s$.

Figure 8:
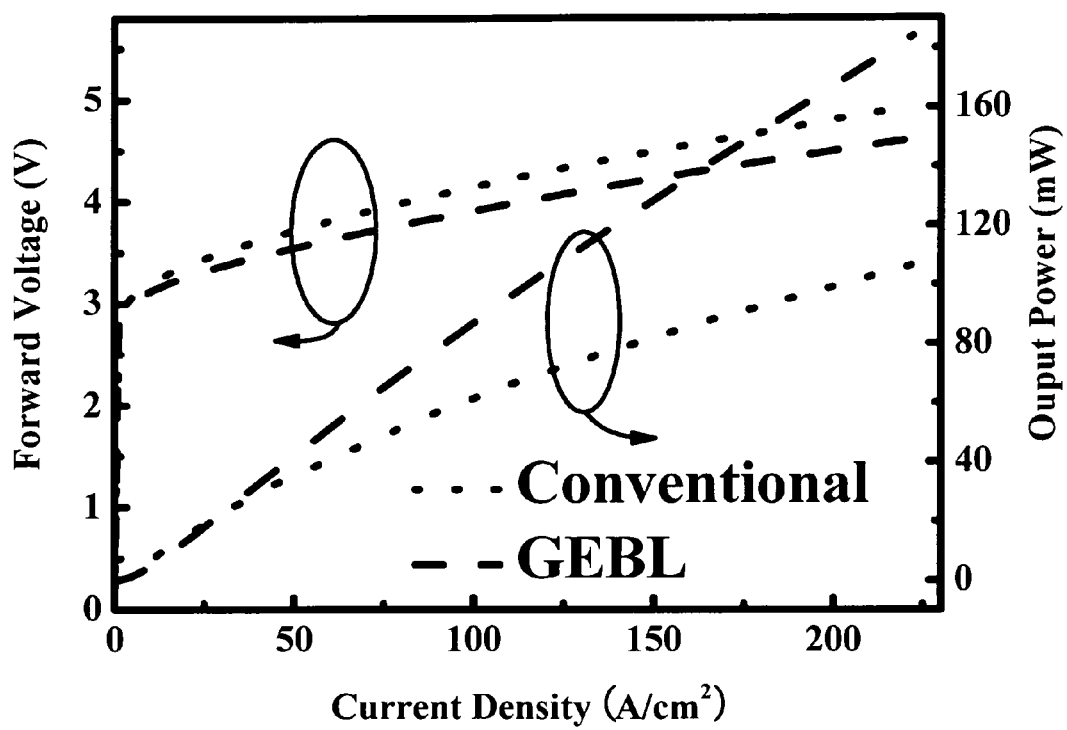
FIG. 8 is a graph illustrating the energy gap of semiconductor light emitting device A, B, C under 100 A/cm$^2$ of current according to the technology disclosed by the invention.
Figure 9:
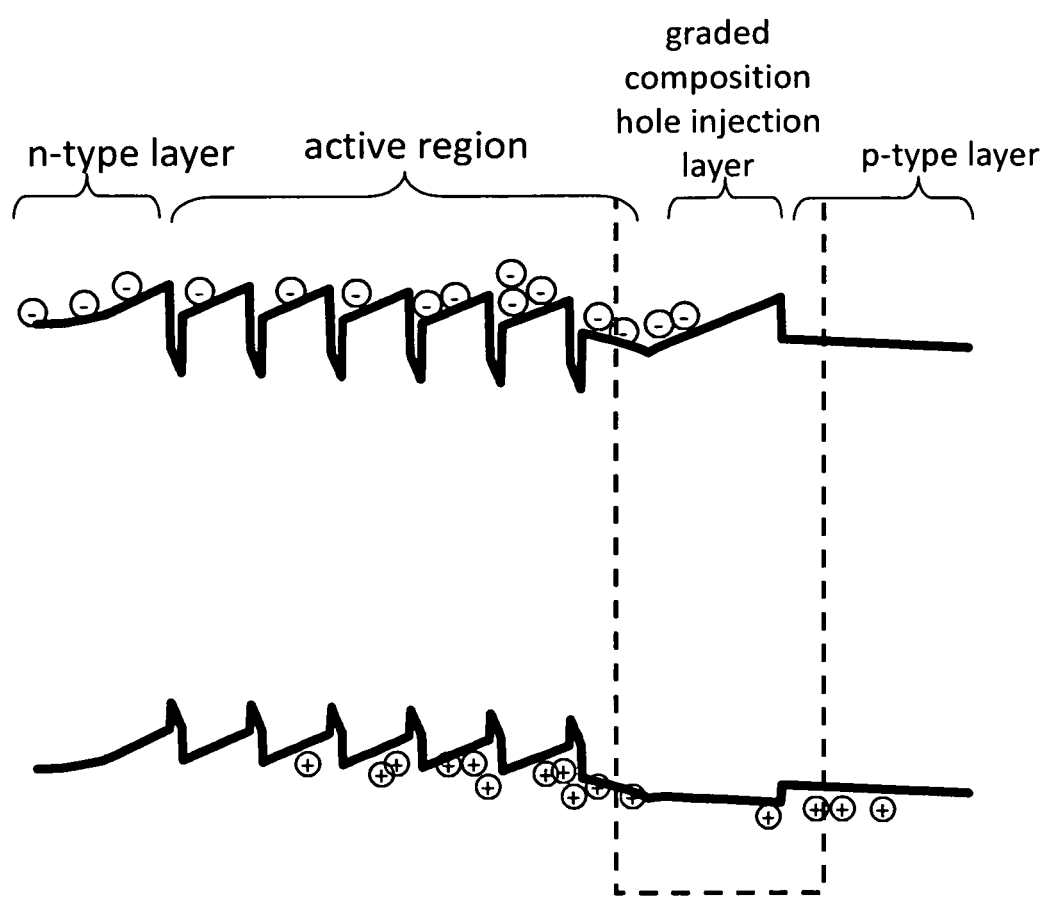
FIG. 9 is a graph illustrating the comparison for the current density and forward bias of a conventional semiconductor light emitting device and a semiconductor light emitting device with the insert layer according to the technology disclosed by the invention.

FIG. 8 illustrates the energy gap of semiconductor light emitting device A, semiconductor light emitting device B, semiconductor light emitting device C under 100 $A/cm^2$ of current. According to the technology disclosed by the invention, the degree of gradually change is related to the ability of electron hole injection. Even if the semiconductor light emitting device 10, semiconductor light emitting device 20 has smaller degree of gradually change, the slope of its valance band can become flat. Then, when the aluminum content at P end (namely P-type semiconductor conductive layer) is increased to 25%, its slope begins to invert. In addition, it is noticed that the energy gap difference $\Delta Ev$ between the gallium nitride barrier (GaN barrier) and the electron blocking layer does not exist in the semiconductor light emitting device 10, semiconductor light emitting device 20 having the insert layer 16, insert layer 36. Thus, the efficiency of electron hole injection may be increased by the insert layer 16, insert layer 36. Meanwhile, when the degree of gradually change is increased, the conduction-valance band offset on the interface between P-type gallium nitride layer (namely P-type semiconductor conductive layer) and the electron blocking layer will also limit the ability of electron. Similarly, the energy gap difference $\Delta Ev$ between the electron blocking layer and the P-type semiconductor conductive layer will be increased with aluminum content, which may block the transmission ability of electron hole. In addition, because of lower acceptor-activation efficiency and low lattice quality in the epitaxy, the electron blocking layer with high aluminum content is not suitable to be used in the application of semiconductor light emitting diode actually.

Thus, according to the above-mentioned description, because the insert layer 16, insert layer 36 can be used as the electron blocking layer and electron hole injection layer, which may decrease the energy barrier of valance band, the barrier of the valence electron band can be reduced so that the electron hole can be injected into the active layer 18, active layer 38 to associate with the electron to emit the light, and the overflow of the electron can be prevented to increase the efficiency of the semiconductor light emitting device.

It is understood that various other modifications will be apparent to and can be readily made by those skilled in the art without departing from the scope and spirit of the invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the invention pertains.

What is claimed is:

1. A semiconductor light emitting device, comprising:
a substrate having a first surface and a second surface;
a first semiconductor conductive layer being disposed on the first surface of the substrate;
an insert layer being disposed on the first semiconductor conductive layer, wherein a material of insert layer being aluminum indium gallium nitride (AlxInyGa1-x-yN), and wherein an aluminum content, an indium content and a gallium content in the aluminum indium gallium nitride (AlxInyGa1-x-yN) being increased from top to bottom, where 0≤x≤0.9, 0≤y≤0.3;
an active layer being disposed on the insert layer;
a second semiconductor conductive layer being disposed on the active layer, and an electric property of the second semiconductor conductive layer being opposite to an electric property of the first semiconductor conductive layer;
a first electrode being disposed on the second semiconductor conductive layer; and
a second electrode being disposed on the second surface of the substrate, wherein an electric property of the second electrode being opposite to an electric property of the first electrode.

2. A semiconductor light emitting device, comprising:
a substrate having a first surface and a second surface;
a first semiconductor conductive layer being disposed on the first surface of the substrate;
an insert layer being disposed on the first semiconductor conductive layer, wherein a material of insert layer being aluminum indium gallium nitride (AlxInyGa1-x-yN), wherein an aluminum content, an indium content and a gallium content in the aluminum indium gallium nitride (AlxInyGa1-x-yN) being decreased from top to bottom, where 0≤x≤0.9, 0≤y≤0.3;
an active layer being disposed on the insert layer;

a second semiconductor conductive layer being disposed on the active layer, and an electric property of the second semiconductor conductive layer being opposite to an electric property of the first semiconductor conductive layer;

a first electrode being disposed on the second semiconductor conductive layer; and a second electrode being disposed on the second surface of the substrate, wherein an electric property of the second electrode being opposite to an electric property of the first electrode.

* * * * *